United States Patent
Krüger et al.

(10) Patent No.: US 8,158,514 B2
(45) Date of Patent: Apr. 17, 2012

(54) METHOD FOR PRODUCING VERTICAL ELECTRICAL CONTACT CONNECTIONS IN SEMICONDUCTOR WAFERS

(75) Inventors: Olaf Krüger, Berlin (DE); Joachim Würfl, Zeuthen (DE); Gerd Schöne, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 67 days.

(21) Appl. No.: 11/916,279

(22) PCT Filed: Jun. 1, 2006

(86) PCT No.: PCT/EP2006/062824
§ 371 (c)(1),
(2), (4) Date: Dec. 26, 2007

(87) PCT Pub. No.: WO2006/128898
PCT Pub. Date: Dec. 7, 2006

(65) Prior Publication Data
US 2008/0206989 A1    Aug. 28, 2008

(30) Foreign Application Priority Data

Jun. 1, 2005 (DE) .......................... 10 2005 026 131
Aug. 31, 2005 (DE) .......................... 10 2005 042 072

(51) Int. Cl.
*H01L 21/44* (2006.01)
(52) U.S. Cl. ................ 438/667; 438/597; 257/E21.476
(58) Field of Classification Search ................ 438/597, 438/637, 667; 257/E21.476
See application file for complete search history.

(56) References Cited

U.S. PATENT DOCUMENTS

| 4,348,253 | A | | 9/1982 | Subbarao et al. |
| 4,897,708 | A | | 1/1990 | Clements |
| 4,964,212 | A | | 10/1990 | Deroux-Dauphin et al. |
| 5,298,444 | A | * | 3/1994 | Ristow .......................... 438/571 |

(Continued)

FOREIGN PATENT DOCUMENTS

EP    0 926 723 A    11/2007

(Continued)

OTHER PUBLICATIONS

L. W. Burgess, "Introducing Via-in-Pad Blind via Technology to Any PCB Multilayer Fabricator", IPC Printed Circuits Expo 1997, Mar. 9-13, 1997, San Jose, CA, S15-2.

(Continued)

*Primary Examiner* — David Vu
*Assistant Examiner* — Duy Nguyen
(74) *Attorney, Agent, or Firm* — Perkins Coie LLP; Aaron Wininger

(57) ABSTRACT

The invention relates to a method for producing vertical electrical connections in semiconductor wafers, the method including the following steps: application of a protective resist to the wafer front side; patterning of the protective resist such that the contacts to be connected to the wafer rear side become free; laser drilling of passage holes at the contact connection locations from the wafer rear side through the semiconductor substrate, the active layers and the contacts to be connected on the wafer front side; cleaning of the wafer; application of a plating base to the wafer rear side and into the laser-drilled passage holes; application of gold by electrodeposition onto the metallized wafer rear side and the passage holes; resist stripping of the protective resist; and application of an antiwetting layer in the region of the entrance openings of the passage holes at the wafer rear side.

10 Claims, 3 Drawing Sheets

U.S. PATENT DOCUMENTS

Figure 1:
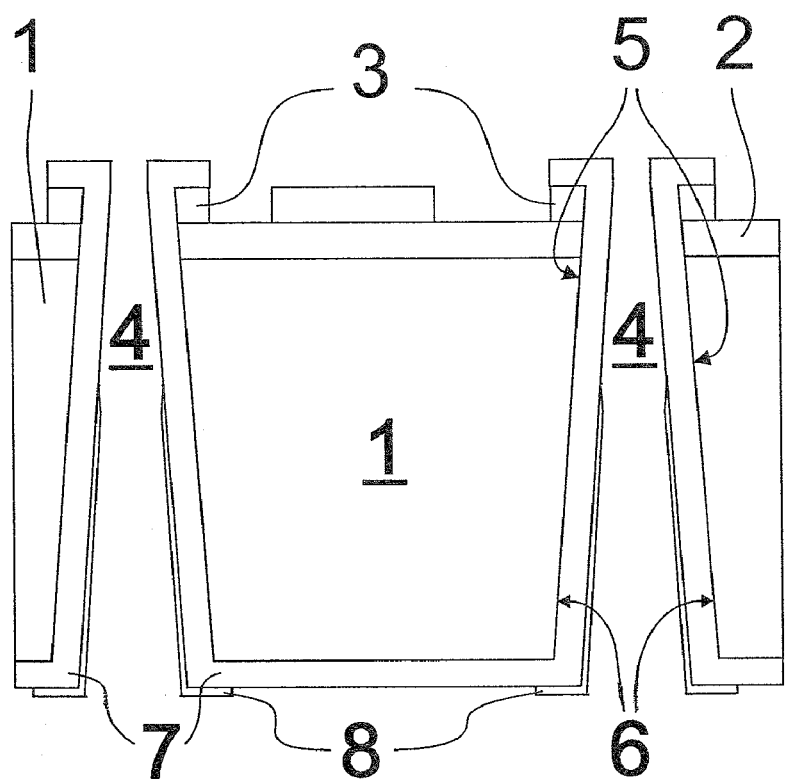
Figure 3:
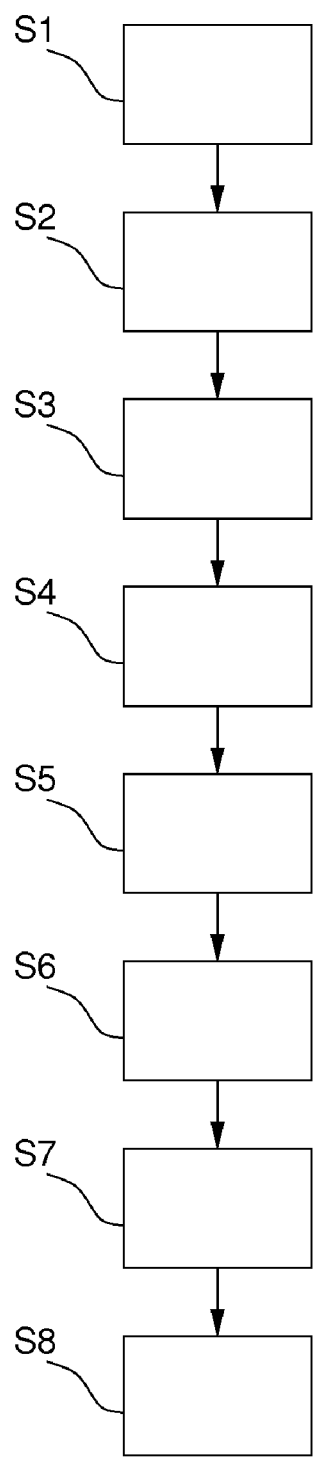

| | | | | |
|---|---|---|---|---|
| 5,350,662 | A * | 9/1994 | Chi | 430/313 |
| 5,682,062 | A * | 10/1997 | Gaul | 257/686 |
| 6,039,889 | A * | 3/2000 | Zhang et al. | 216/17 |
| 6,110,825 | A * | 8/2000 | Mastromatteo et al. | 438/667 |
| 6,235,554 | B1 * | 5/2001 | Akram et al. | 438/109 |
| 6,873,054 | B2 * | 3/2005 | Miyazawa et al. | 257/774 |
| 2001/0005627 | A1 * | 6/2001 | Matsubara | 438/637 |
| 2001/0028113 | A1 | 10/2001 | Kosaki et al. | |
| 2002/0046995 | A1 | 4/2002 | Chang et al. | |
| 2002/0190371 | A1 * | 12/2002 | Mashino et al. | 257/690 |
| 2003/0201260 | A1 * | 10/2003 | Steur et al. | 219/121.71 |
| 2004/0104451 | A1 * | 6/2004 | Ooi et al. | 257/532 |
| 2005/0057908 | A1 * | 3/2005 | Egitto et al. | 361/795 |
| 2005/0104228 | A1 * | 5/2005 | Rigg et al. | 257/786 |
| 2005/0127479 | A1 * | 6/2005 | Cohen | 257/627 |

FOREIGN PATENT DOCUMENTS

| | | |
|---|---|---|
| WO | 02/060636 A1 | 8/2002 |

OTHER PUBLICATIONS

A. Cable, "Improvements in High Speed Laser Microvia Formation Using Solid State Nd: YAG UV Lasers", IPC Printed Circuits Expo 1997, Mar. 9-13, 1997, San Jose, CA, S17-17.

M. D. Owen, "Via drilling", In: J. F. Ready, D. F. Farson (Edtrs.): LIA Handbook of laser materials processing, Laser Institute of America, Magnolia Publishing (2001) 661-665.

Widmann, D. et al.: ISBN 3-540-59357-8, Apr. 1996.

* cited by examiner

9

2

1

FIG. 2

METHOD FOR PRODUCING VERTICAL ELECTRICAL CONTACT CONNECTIONS IN SEMICONDUCTOR WAFERS

This application is a U.S. national stage entry under 35 U.S.C. §371 of PCT/EP2006/062824 filed Jun. 1, 2006, which claims priority to DE 10 2005 026 131.0 filed Jun. 1, 2005 and DE 10 2005 042 072.9 filed Aug. 31, 2005.

FIELD OF THE INVENTION

The invention relates to a method for the production of vertical electrical contact connections (micro-vias, via=vertical interconnect access) in semiconductor wafers for the fabrication of semiconductor devices, i.e., of contacts on the front side of the wafer through the semiconductor wafer, to the rear side of the wafer.

BACKGROUND

The continued progressing miniaturization of electronic devices requires an increasingly more compact peripheral integration. Short vertical connections represent an efficient path of electrical contacting. In addition, it is necessary for physical reasons—in order to increase the gain and the maximum output performance of high-performance transistors available per chip—to establish a low-induction electrically conductive connection between the source contacts on the front side and the ground electrode on the rear side. However, considering the technology, this is not always easy to implement.

At the present time, electrically active GaN material (gallium nitride) is virtually not available as a monocrystalline wafer material and is therefore epitactically grown on substrate materials, such as, for example, SiC wafers (silicon carbide). SiC is distinguished by very good thermal conductivity, as well as by an extremely high chemical stability and by great hardness. In order to achieve rear-side contacting of GaN transistors, it is thus necessary to drill through the SiC carrier material, as well as through the superimposed GaN epitaxial layer. Until now, virtually only dry-chemistry etching processes could be used for texturing, such as reactive ion etching in high-performance plasma etching reactors that are specifically optimized for this purpose. Typical plasma etching rates of SiC, however, are 1 µm/min and thus very low. In addition, the use of plasma etching technology requires the fabrication and lithographic texturing of a durable etching mask.

It has been known that vias can be produced in printed circuit boards with the use of lasers. Considering these technologies, the laser is used to drill openings into the copper and dielectric layers, said layers then being metallized in order to produce connections between specific layers. The different laser technologies use $CO_2$ lasers, frequency-doubled (green) YAG lasers, excimer lasers and UV:YAG lasers.

The production of these vias has been described in the following, for example:

L. W. Burgess: "Introducing Via-in-Pad Blind Via Technology to Any PCB Multilayer Fabricator." IPC Printed Circuits Expo 1997, Mar. 9-13, 1997, San Jose, Calif., S15-2.

A. Cable: "Improvements in High Speed Laser Microvia Formation Using Solid State Nd:YAG UV Lasers." IPC Printed Circuits Expo 1997, Mar. 9-13, 1997, San Jose, Calif., S17-7.

M. D. Owen: "Via drilling." In: J. F. Ready, D. F. Farson (Edtrs.): LIA Handbook of laser materials processing, Laser Institute of America, Magnolia Publishing (2001) 661-665.

Methods for the production of vias in substrates have also been known from documents EP 0 926 723 A and U.S. Pat. No. 4,964,212. In these cases, blind holes are drilled into the substrate from the rear side of the wafer. The semiconductor substrate that is named is silicon. Referring to document U.S. Pat. No. 4,964,212 A, a Q-switched Nd:YAG laser (wavelength, 1.06 µm) is used, and reference is made to U.S. Pat. No. 4,437,109 where the use of a frequency-doubled Nd:YAG laser (wavelength, 0,53 µm) is mentioned. An (isolator) layer is applied to the front side of the waver, said layer acting as a laser etching stop, because said layer does not absorb laser radiation. In this case, a metal layer of a contact that absorbs laser radiation would be out of the question.

In accordance with document EP 0 926 723 A a protective layer of metal (Cr) is applied to the rear side, said layer reflecting the laser radiation. Laser machining occurs after the chromium layer has been opened at the machining sites, so that the substrate may be ablated by the laser radiation. To do so, lithographic texturing of the rear side is required. The isolator layer must not deposit on the bottom of the hole, or the layer must later again be removed from the front side (otherwise no electrical contact with the front side would be produced during the subsequent metallization). Consequently, the method is very complicated and uneconomical.

Document US 2005/104 228 A1 deals with methods of packaging micro-electronic devices and with the production of vias and conductive connections in microchips. The fabrication of vertically conductive connections through a chip with an integrated circuit (wafer-level packaging) is described for the use in multi-chip stacks. The surface of the chip is provided with a "redistribution layer" (RDL) of conducting paths that are connected at one end to the bond pad and lead laterally away from there (to solder spheres). The objective is to electrically connect stacked chips to each other. Following the fabrication of the conducting paths, an opening is produced on and in the bond pad, i.e., the metal is completely removed by etching. Later, a hole is produced from the rear side at the same site by the laser. The laser is adjusted relative to the bond pad with the aid of pattern recognition; then said laser drills through the chip at the created opening in the metal, i.e., the bond pad metal is not drilled through. Passivation layers protect the front and rear sides during the laser process and during the subsequent cleaning done by etching. The production of the vertical electrical connection consists of numerous method steps (deposition of $TiCL_4$, TiN, reverse etching, currentless Ni deposition after surface activation by immersion in HF:Pd, metal filling with solder or by electroplating), these making the overall process relatively complex.

Consequently, until now, no effective method based on laser technology has been available for the fabrication of micro-vias in semiconductor wafers.

SUMMARY

The object of the invention is to show an effective method for the production of micro-vias in semiconductor wafers of materials that display great hardness and chemical stability such as silicon carbide, sapphire or the like.

In accordance with this, the method is characterized by the following steps:
  Application of a protective varnish on the front side of the wafer;
  Texturing of the protective varnish on the front side of the wafer so that the contacts to be connected to the rear side of the wafer become exposed;

Laser drilling of through holes at the contact connection sites from the rear side of the wafer through the semiconductor substrate, the active layers and the contacts to be connected on the front side of the wafer;

Cleaning of the wafer (removal of debris);

Application of a plating base on the rear side of the wafer and in the laser-drilled through holes;

Application of gold by electroplating to the metallized rear side of the wafer and to the through holes;

Stripping of the protective varnish;

Application of a dewetting layer in the region of the entry openings of the through holes on the rear side of the wafer.

An SiC wafer is suitably cleaned by wet chemistry with buffered hydrofluoric acid.

Appropriately, titanium is used for the dewetting layer, whereby said layer may be applied by sputtering. The dewetting layer is appropriately applied with the aid of a shadow mask.

A UV laser, preferably a frequency-tripled Nd:YAG laser having a wavelength of 355 nm, is suitable.

The plating base in the micro-vias can be applied by several methods. Preferably, an oblique vapor-deposition, a chemical bath deposition (currentless) or also a sputter deposition are possible.

The method offers the advantage that high-precision micro-vias can be produced in hard and chemically inert substrate materials, while the time required therefor is reduced considerably. In addition, etching masks are not required and there is no stripping of the substrates.

Hereinafter, the invention will be explained in detail with reference to an exemplary embodiment. The associated schematic drawing comprising FIG. 1 shows a cross-section of a wafer with a transistor set-up and the finished micro-vias.

DETAILED DESCRIPTION

The wafer comprises an SiC substrate 1 having a thickness of approximately 250 to 400 µm, on which an AlGaN/GaN layer stack 2 having a thickness of approximately 2 to 3 µm has been epitactically grown. The terminal contacts of a transistor are provided on the layer stack 2 on the front side of the wafer, said contacts being a drain contact, a gate contact and a source contact 3. The potential of the source contact 3 must be returned to the rear side (ground electrode) of the wafer, this being achieved with the aid of a micro-via 4 having metallized hole walls 5, so that the source contact 3 on the front side is electrically connected to the ground electrode on the rear side of the wafer.

The process management of the method in accordance with the invention and the achieved results will be described hereinafter. The processed finished GaN transistors or MMICs are provided with the micro-vias 4 in the wafer assembly. First, the front side of the wafer is coated with a protective varnish in order to protect the wafer during the subsequent method steps. During a second step, the protective varnish is textured, i.e., it is provided with openings on the contact pads, said openings being drilled through. During a third step, the laser is used to drill through-holes from the rear side of the wafer in such a manner that the hole exit openings extend centered through the source contacts 3 of the transistors on the front side of the wafer. Loose particles (debris) that have settled on the sample during the drilling process are subsequently removed during a wet-chemistry cleaning step. This is suitably achieved by etching in buffered hydrofluoric acid with the application of ultrasound. Subsequently, a plating base is applied to the inside of the through holes. In so doing, a thin metal layer 6 is vapor-deposited on the rear side of the wafer. In so doing, the sample is held at a tilt in order to achieve a cohesive coverage of the hole wall 5. The plating base obtained by the metal layer 6 is subsequently reinforced by being electro-plated with a gold layer 7 having a thickness of approximately 5 µm. In this manner, a cohesive gold layer 7 is used to establish an electrical connection from one side of the wafer to its other side.

Microscope images demonstrate that the through holes pass through the center of the contact pads. Referring to a cross-section through a laser bore, it can be seen that the hole wall 5 is fully metallized, i.e., the metal layer 6/gold layer 7 are cohesive from the rear side of the wafer to the contact pad. The implemented micro-vias 4 (hollow rivet vias) display an aspect ratio of 4.

Following the metallization, the protective varnish is stripped during an additional process step.

When soldering the devices that are later produced from the wafer, the solder must be prevented from passing fountain-like through the micro-vias 4 and from allowing solder spray and spheres to deposit on the front side of the devices. To achieve this, a dewetting layer 8 of titanium is provided on the rear side at the via-entry openings. A 100-nm thick titanium layer, to which a gold layer 7 has been applied by sputtering, later prevents the fountain-like passage of solder through to the device's front side. The dewetting layer 8 is applied to the wafer in a textured manner with the aid of a shadow mask. The shadow mask comprises a metal foil having a thickness of 0.1 mm, whereby openings are drilled into said foil by means of a laser. The layout of the openings in the metal foils corresponds to the arrangement of the micro-vias 4 on the wafer. The diameters of the openings in the shadow mask are somewhat larger than the entry diameter of the micro-vias 4 on the rear side of the wafer, so that a titanium ring having a width of approximately 40 µm is formed around the via-entry openings. With the use of four additional through bores at the edge of the shadow mask and the wafer, the two elements are adjusted relative to each other by means of locating pins, i.e., said two elements are superimposed in a congruent manner.

It should be noted that the protective varnish may even be stripped after the deposition of the dewetting layer 8 (titanium dewetting layer).

In view of the ablation rate, flexibility and reliability, a frequency-tripled Nd:YAG laser is well-suited for machining the extremely hard and chemically inert SiC. This laser delivers high-energy nano-second-pulses in the ultraviolet region of the spectrum at a wavelength of 355 nm and at pulse frequencies of up to 100 kHz. The laser beam is moved with micrometer accuracy by combining a CNC-controlled movement of the sample table and the beam deflection with a galvo scanner. With the use of image recognition and a highly accurate air-cushioned XY cross table, the laser beam can be positioned with an accuracy of ±1 µm relative to the existing structures on the workpiece. This precision is even achieved when laser texturing occurs on the rear side and the adjustment marks are located on the front side (located on the bottom).

In order to produce through bores having a width of 100 µm and the smoothest possible walls, the laser beam having a diameter of 15-20 µm is suitably moved on the sample, for example in a circular manner.

An automated drilling process was used, whereby the respective machining site of the sample was positioned under the beam exit in that the sample table was precisely moved with micrometer accuracy, and then the laser beam was rapidly moved by means of a mirror system (galvo scanner) on the workpiece, whereby an SiC having a thickness of 250-450 µm was used. When viewed in the scanning electron microscope, it can be easily seen that the laser-drilled holes are slightly conical and that a smooth wall can be produced.

Resistance measurements performed on an SiC sample confirmed that a low-ohmic connection can be established between the front and rear sides. To do so, the entire surface of one side of a sample was first metallized with a gold layer having a thickness of 5 µm. Then, from the other side, a matrix of holes were drilled through. The distances between the holes were 250 µm and 500 µm, respectively. Subsequently, this surface, including the holes, was metallized as described above. Before measuring the resistance through a single hole, the individual holes had to be electrically separated from each other. To achieve this, the gold layer was scratched in order to obtain fields having an area of 250×250 µm² and 500×500 µm², respectively, each field having one through-via.

Highly homogeneous contacting through the SiC sample was achieved with good reproducibility. The resistance values are at 25-28 mΩ. The mean value across the 207 micro-vias was at 27±0.5 mΩ.

In tests with set-up transistors of different types, the functionality of the devices was demonstrated. With reference to the characteristic lines of the transistors, proof was provided of the successful implementation of laser-drilled micro-vias in GaN process technology.

Technological investigations show that it is possible to implement laser-drilled micro-vias through monocrystalline SiC wafer material for high-performance GaN field effect transistors. Proof could be provided that laser-generated micro-texturing can be successfully implemented in device process-technology.

The prerequisite for the application of laser micro-machining in processing semiconductor wafers is the high positioning-accuracy of the beam center of ±1 µm and better. This accuracy relates to beam positioning relative to the existing device structures and must be achieved when machining the front side, as well as when machining the rear side.

LIST OF REFERENCE NUMBERS

1 SiC Substrate
2 AlGaN/GaN layer stack
3 Source contact
4 Micro-via
5 Hole wall
6 Metal layer
7 Gold layer
8 Dewetting layer
9 Protection Varnish
S1 application of a protective varnish
S2 texturing of the protective varnish
S3 laser drilling of through holes
S4 cleaning of the wafer
S5 application of a plating base
S6 application of gold
S7 stripping of the protective varnish
S8 application of a dewetting layer

The invention claimed is:

1. A method for the production of vertical electrical contact connections in semiconductor wafers for the fabrication of semiconductor devices, including contacts on the front side of the wafer through the semiconductor wafer, to the rear side of the wafer, comprising:
application of a protective varnish on the front side of the wafer;
texturing of the protective varnish on the front side of the wafer so that source contacts facing the front side of the wafer become exposed;
laser drilling of through holes at the exposed contact connection sites from the rear side of the wafer through a semiconductor substrate, active layers formed on the semiconductor substrate and the source contacts facing the front side of the wafer such that the through holes travel completely through from the rear side to the front side of the wafer, the active layers and the source contacts facing the front side;
cleaning of the wafer;
application of a plating base on the rear side of the wafer and in the laser-drilled through holes;
application of gold by electroplating to a metallized rear side of the wafer and to the through holes;
stripping of the protective varnish; and
application of a dewetting layer in the region of the entry openings of the through holes on the rear side of the wafer,
wherein said method is carried out one after the other in the order recited above.

2. The method of claim 1, wherein the cleaning occurs by wet chemistry with buffered hydrofluoric acid.

3. The method of claim 1, wherein titanium is used for the dewetting layer.

4. The method of claim 1, wherein the dewetting layer is applied by deposition-sputtering.

5. The method of claim 1, wherein the dewetting layer is applied with the aid of a shadow mask.

6. The method of claim 1, wherein a UV laser is used for the laser drilling.

7. The method of claim 1, wherein the application of the plating base is done by oblique vapor-deposition.

8. The method of claim 1, wherein the application of the plating base is done by sputtering.

9. The method of claim 1, wherein the application of the plating base is done by chemical bath deposition.

10. The method of claim 1, wherein a laser is used for the laser drilling, said laser having a beam that is smaller than the cross-sectional area of the through hole that is to be generated, whereby the beam is moved over the area of the through hole.

* * * * *